(12) United States Patent
Ando et al.

(10) Patent No.: US 10,658,582 B2
(45) Date of Patent: May 19, 2020

(54) VERTICAL RESISTIVE PROCESSING UNIT WITH AIR GAP

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 29 days.

(21) Appl. No.: 16/001,515

(22) Filed: Jun. 6, 2018

(65) Prior Publication Data
US 2019/0378976 A1    Dec. 12, 2019

(51) Int. Cl.
*G11C 13/00* (2006.01)
*H01L 45/00* (2006.01)

(52) U.S. Cl.
CPC ...... *H01L 45/1233* (2013.01); *G11C 13/0007* (2013.01); *H01L 45/1253* (2013.01); *H01L 45/1616* (2013.01)

(58) Field of Classification Search
CPC ............. H01L 45/1233; H01L 45/1253; H01L 45/1616; G11C 13/0007
See application file for complete search history.

(56) References Cited

U.S. PATENT DOCUMENTS

| 9,391,269 | B2 | 7/2016 | Lee et al. | |
|---|---|---|---|---|
| 2014/0054537 | A1* | 2/2014 | Lee | H01L 45/1253 257/4 |
| 2014/0273495 | A1* | 9/2014 | Kim | H01L 27/11524 438/733 |
| 2014/0319445 | A1* | 10/2014 | Cho | H01L 45/06 257/4 |
| 2015/0214478 | A1 | 7/2015 | Lee et al. | |
| 2016/0247711 | A1 | 8/2016 | Kim | |

(Continued)

FOREIGN PATENT DOCUMENTS

JP    2016066775 A    4/2016

OTHER PUBLICATIONS

Baek et al., "Realization of vertical resistive memory (VRRAM) using cost effective 3D process", In IEEE Int. Electron Devices Meet. Tech. Dig. 2011, pp. 737-740.

(Continued)

*Primary Examiner* — Mohammed A Bashar
(74) *Attorney, Agent, or Firm* — Cantor Colburn LLP; Vazken Alexanian

(57) ABSTRACT

A vertical resistive unit is provided. The vertical resistive unit includes first and second resistive random access memory (ReRAM) cells. The first ReRAM cell includes first vertically aligned horizontal electrode layers and first vertical electrodes operably extending through the first vertically aligned horizontal electrode layers. The second ReRAM cell includes second vertically aligned horizontal electrode layers and second vertical electrodes operably extending through the second vertically aligned horizontal electrode layers. The first and second ReRAM cells are disposed to define an air gap between the first and second ReRAM cells.

20 Claims, 9 Drawing Sheets

(56) References Cited

U.S. PATENT DOCUMENTS

2018/0033961 A1* 2/2018 Yi ..................... H01L 27/2436

OTHER PUBLICATIONS

Steinbuch, "Die Lemmatrix", Kybernetik 1, 1961, pp. 36-45.
Wong et al., "Metal-oxide RRAM", Proceedings of the IEEE 100(6), 2012, pp. 1951-1970.
Waser, "Integration of TiO2 into Nano-Crossbar Arrays with 100 nm Half Pitch for Resisitve RAM Applications", URL: <http://www.emrl.de/r_a_1.html>, Online Retrieved 2018, 10 pages.

* cited by examiner

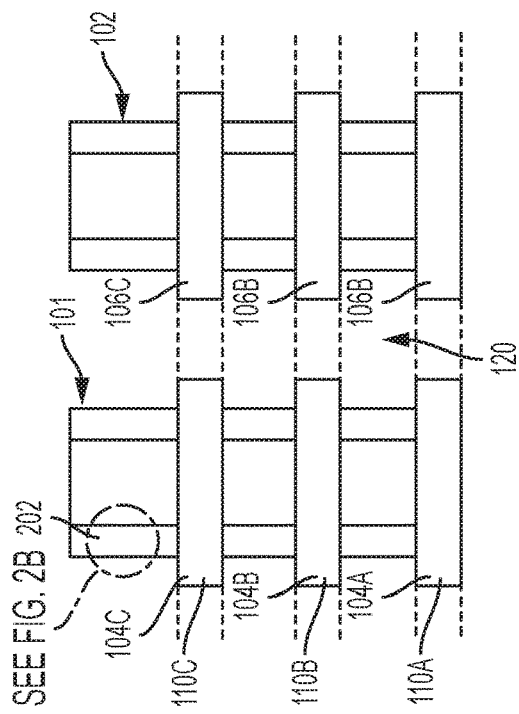
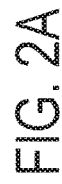
FIG. 2A
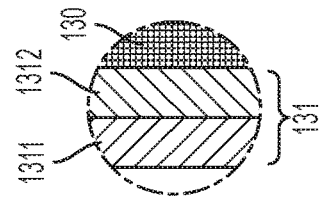
FIG. 2B
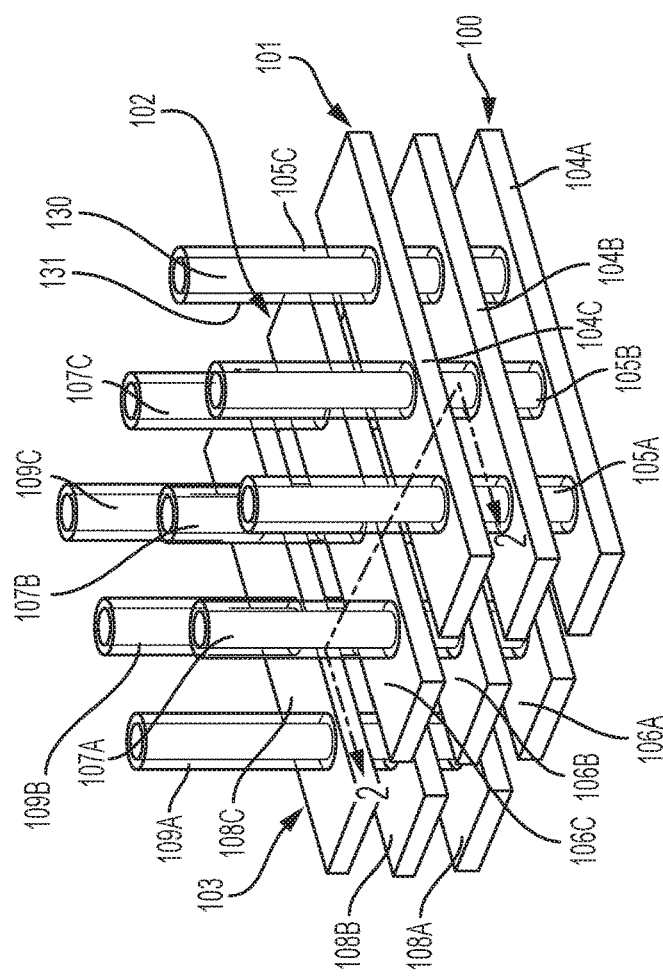
FIG. 1

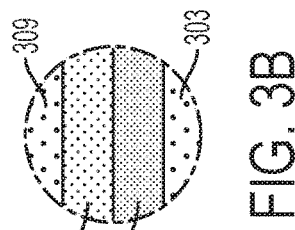
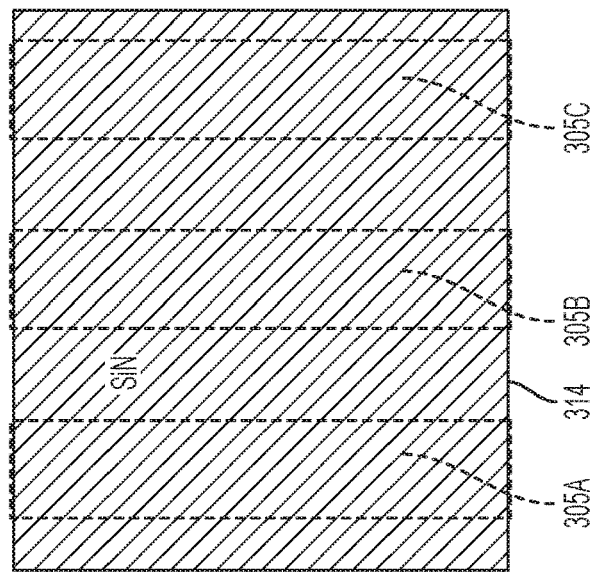
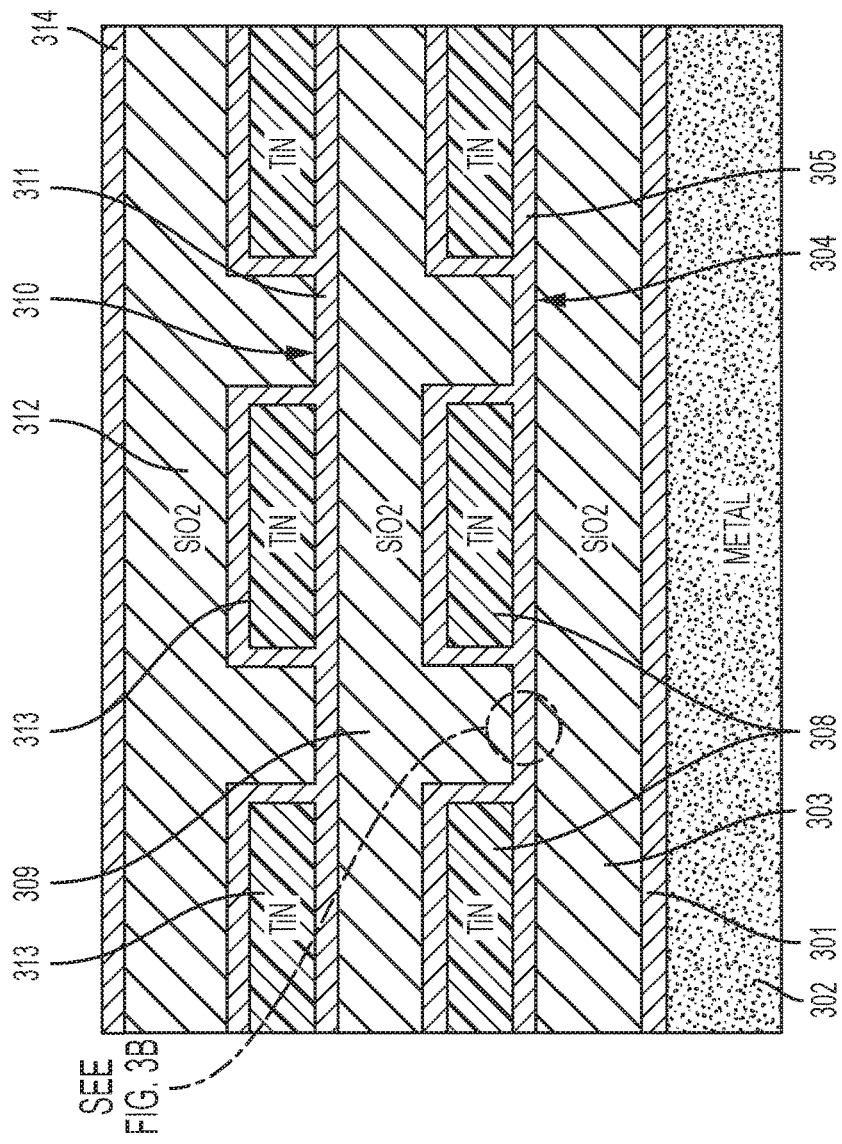

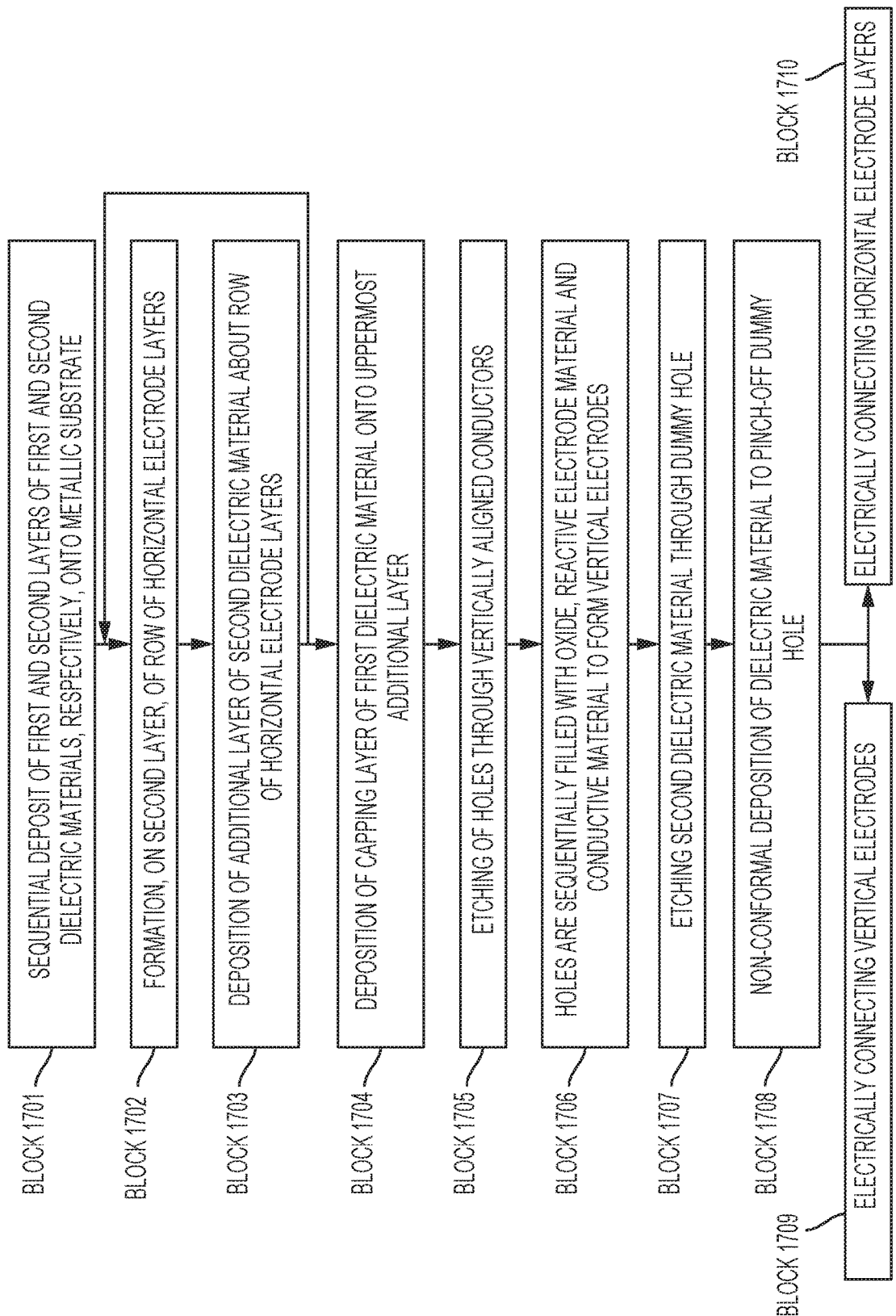

VERTICAL RESISTIVE PROCESSING UNIT WITH AIR GAP

BACKGROUND

The present invention generally relates to resistive random access memory (ReRAM). More specifically, the present invention relates to a ReRAM structure with an air gap.

ReRAM is considered to be a promising technology for electronic synapse devices or memristors for neuromorphic computing as well as high-density and high-speed non-volatile memory applications. In neuromorphic computing applications, a resistive memory device can be used as a connection (or a synapse) between a pre-neuron and a post-neuron thus representing the connection weight in the form of device resistance. Multiple pre-neurons and post-neurons can be connected through a crossbar array of ReRAMs, which naturally expresses or is representative of a fully-connected neural network.

SUMMARY

Embodiments of the present invention are directed to a vertical resistive unit. A non-limiting example of the vertical resistive unit includes first and second resistive random access memory (ReRAM) cells. The first ReRAM cell includes first vertically aligned horizontal electrode layers and first vertical electrodes operably extending through the first vertically aligned horizontal electrode layers. The second ReRAM cell includes second vertically aligned horizontal electrode layers and second vertical electrodes operably extending through the second vertically aligned horizontal electrode layers. The first and second ReRAM cells are disposed to define an air gap between the first and second ReRAM cells.

Embodiments of the present invention are directed to a vertical resistive unit fabrication method. A non-limiting example of the vertical resistive unit fabrication method includes sequentially depositing first and second layers of first and second dielectric materials, respectively, onto a conductive substrate. A row of horizontal electrode layers are formed on the second layer and respectively include first and second horizontal layers of the first dielectric material and conductors interleaved in a pattern between corresponding first and second horizontal layer sections. The resistive unit fabrication method further includes depositing an additional layer of the second dielectric material about the row of the horizontal electrode layers. The forming of the row of the horizontal electrode layers and the depositing of the additional layer can be repeated with a capping layer of the first dielectric material ultimately deposited onto an uppermost additional layer. The vertical resistive unit fabrication method further includes etching holes through vertically aligned conductors that are sequentially filled with oxide, reactive electrode material and conductive material to form vertical electrodes. In addition, the vertical resistive unit fabrication method includes etching the second dielectric material exposed by a dummy hole extending to the first layer.

Embodiments of the invention are directed to a vertical resistive unit. A non-limiting example of the vertical resistive unit includes a first dielectric material layer disposed on a conductive substrate, a dielectric material capping layer defining a dummy hole aperture and one or more rows of horizontal electrode layers interposed between the first dielectric material layer and the dielectric material capping layer. Each horizontal electrode layer respectively includes first and second horizontal dielectric material layers and conductors interleaved in a pattern between corresponding sections of the first and second horizontal dielectric material layers. The vertical resistive unit further includes vertical electrodes extending through vertically aligned conductors of vertically aligned horizontal electrode layers and includes sequential layers of oxide, reactive electrode material and conductive material. The vertical resistive unit also includes a layer of non-conformal dielectric material disposed on the dielectric material capping layer to pinch-off the dummy hole aperture.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 is a perspective view of a vertical resistive unit in accordance with embodiments of the present invention;

FIG. 2A is a cross-sectional view of the vertical resistive unit of FIG. 1 taken along line 2-2;

FIG. 2B is an enlarged view of the encircled portion of FIG. 2A;

FIG. 3A is a side view of dielectric layers interleaved with rows of horizontal electrode layers over a conductive substrate in accordance with embodiments of the present invention;

FIG. 3B is an enlarged view of the encircled portion of FIG. 3A;

FIG. 4 is a top-down view of the features of FIG. 3;

FIG. 17 is a flow diagram illustrating a vertical resistive unit fabrication method in accordance with embodiments of the present invention.

Figure 6:
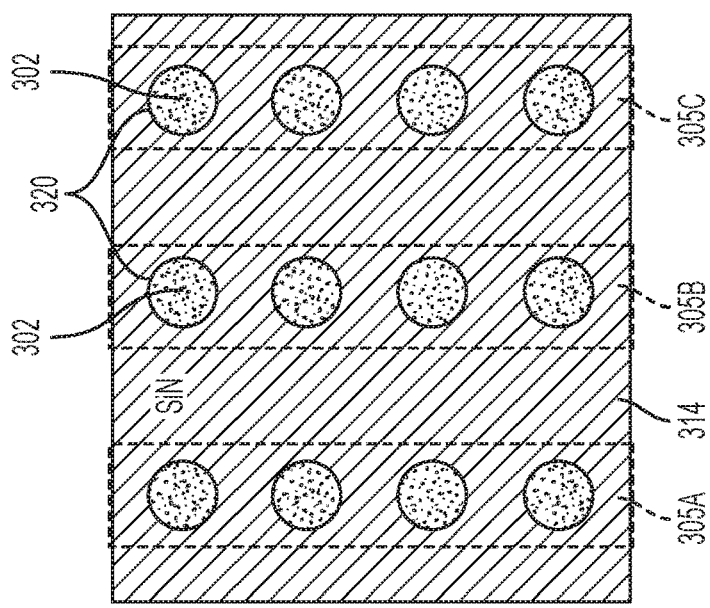
FIG. 6 is a top-down view of the features of FIG. 5.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, densities of ReRAM devices can be increased by vertically stacking ReRAM stacks as practiced in Flash NAND technology. ReRAM stacks are, however, typically deposited by physical vapor deposition (PVD) to control the oxygen vacancy concentration in the metal oxide layer. This often inhibits the vertical stacking of the ReRAM stacks in that it can be difficult to provide for air gaps between stack layers without exposing ReRAM stack components to destructive chemicals. This problem was recently addressed by a proposal to form a ReRAM stack by atomic layer deposition (ALD) of a tantalum oxide/barrier layer/chemical vapor deposition (CVD) of titanium nitride but resulted in a parasitic capacitance between ReRAM cells in aggressively scaled ReRAM arrays.

Turning now to an overview of the aspects of the invention, one or more embodiments of the invention address the above-described shortcomings of the prior art by providing for a ReRAM structure with an air gap defined between ReRAM cells. The air gap is formed in a manner whereby the ReRAM stack components are not exposed to destructive chemicals. The formation of the air gap is achieved by the formation of horizontal electrodes of titanium nitride through ALD, the use of hafnium oxide or tantalum oxide as base oxides that are deposited via ALD, the formation of vertical electrodes including titanium nitride and an aluminum alloy and by an etching of interlayer dielectric (ILD) between ReRAM cells through dummy vias.

The above-described aspects of the invention address the shortcomings of the prior art by providing for the formation of a vertical resistive unit or a ReRAM structure in which an air gap, which is defined between adjacent ReRAM cells, is formed without exposing the ReRAM cell components to destructive chemicals that might otherwise cause the ReRAM cell components to be damaged or break down.

Turning now to a more detailed description of aspects of the present invention, FIG. 1 a vertical resistive unit 100, which can be configured or provided as a ReRAM array. The vertical resistive unit 100 includes first ReRAM cells 101, second ReRAM cells 102 and third ReRAM cells 103. The first ReRAM cells 101 include first vertically aligned horizontal electrode layers 104A, 104B and 104C and first vertical electrodes 105A, 105B and 105C that operably extend through the first vertically aligned horizontal electrode layers 104A, 104B and 104C. The second ReRAM cells 102 include second vertically aligned horizontal electrode layers 106A, 106B and 106C and second vertical electrodes 107A, 107B and 107C that operably extend through the second vertically aligned horizontal electrode layers 106A, 106B and 106C. The third ReRAM cells 103 include third vertically aligned horizontal electrode layers 108A, 108B and 108C and third vertical electrodes 109A, 109B and 109C that operably extend through the second vertically aligned horizontal electrode layers 108A, 108B and 108C.

While the embodiment illustrated in FIG. 1 illustrates that the vertical resistive unit 100 includes only the first, second and third ReRAM cells 101, 102 and 103 and while the first, second and third ReRAM cells 101, 102 and 103 each include three vertically aligned horizontal electrode layers and three vertical electrodes, it is to be understood that this configuration is not required and that other alternative configurations are possible. For example, the vertical resistive unit 100 can include additional ReRAM cells and each ReRAM cell can include more or less horizontal electrode layers and more or less vertical electrodes.

Each of the first vertically aligned horizontal electrode layers 104A-C extends along respective longitudinal lengths thereof and is substantially vertically aligned with a horizontal electrode layer above or below. Vertical distances between the first vertically aligned horizontal electrode layers 104A-C can vary according to multiple factors and requirements. Similarly, the longitudinal lengths of each of the first vertically aligned horizontal electrode layers 104A-C can also vary according to multiple factors and requirements. Each of the second vertically aligned horizontal electrode layers 106A-C extends along respective longitudinal lengths thereof and is substantially vertically aligned with a horizontal electrode layer above or below. Vertical distances between the second vertically aligned horizontal electrode layers 106A-C can vary according to multiple factors and requirements. Similarly, the longitudinal lengths of each of the second vertically aligned horizontal electrode layers 106A-C can also vary according to multiple factors and requirements. Each of the third vertically aligned horizontal electrode layers 108A-C extends along respective longitudinal lengths thereof and is substantially vertically aligned with a horizontal electrode layer above or below. Vertical distances between the third vertically aligned horizontal electrode layers 108A-C can vary according to multiple factors and requirements. Similarly, the longitudinal lengths of each of the third vertically aligned horizontal electrode layers 108A-C can also vary according to multiple factors and requirements.

Figure 5:
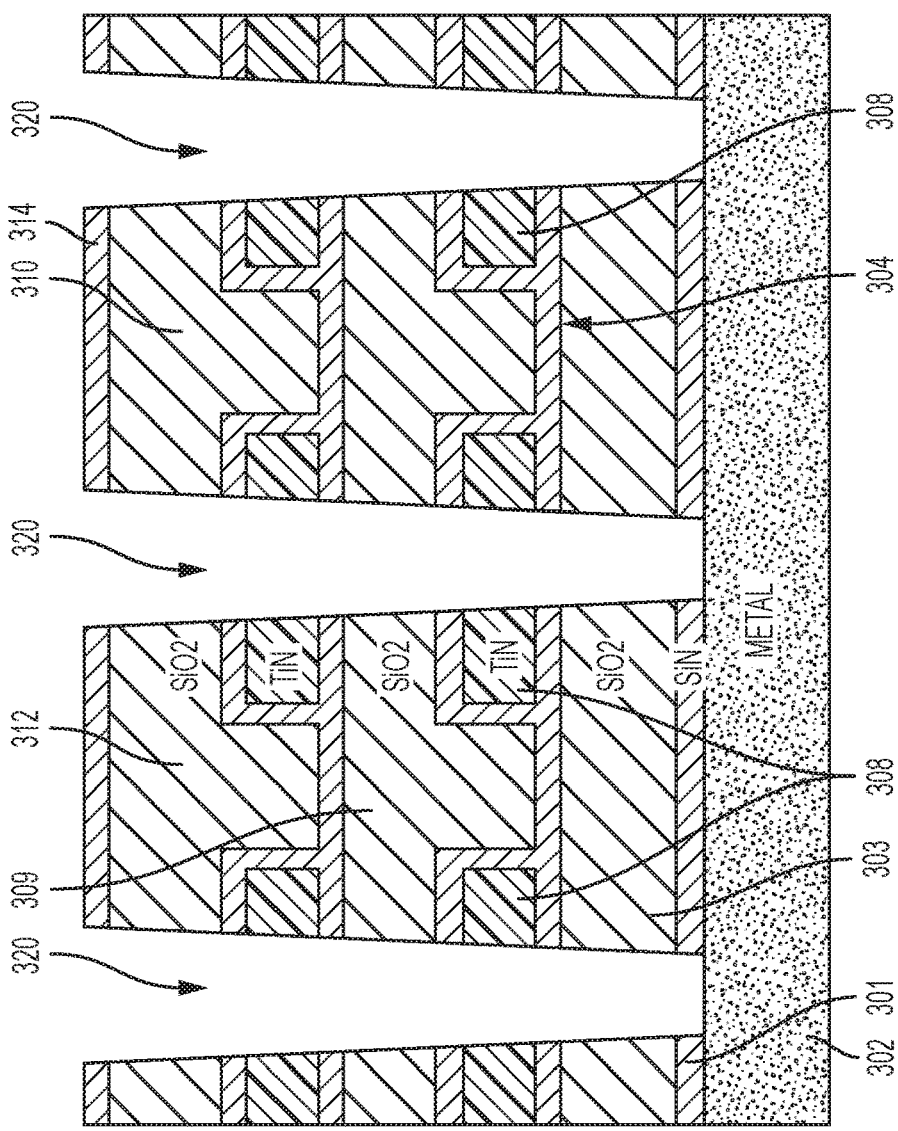
FIG. 5 is a side view of etched holes extending through vertically aligned conductors of the rows of horizontal electrode layers of FIG. 3 in accordance with embodiments of the present invention.

In addition, it is to be understood that each of the first vertically aligned horizontal electrode layers 104A-C of the first ReRAM cells 101, that each of the second vertically aligned horizontal electrode layers 106A-C of the second ReRAM cells 102 and that each of the third vertically aligned horizontal electrode layers 108A-C of the third ReRAM cells 103 include horizontal array patterns of patterned conductive elements that are encompassed between layers of dielectric material as illustrated in FIGS. 3, 5, . . . , 13 and 15 (to be described below). The patterned conductive elements can be formed of titanium nitride or another suitable electrically conductive material and the layers of the dielectric material can be formed of silicon nitride or another suitable dielectric material. It is to be further understood that each of the first vertical electrodes 105A-C, that each of the second vertical electrodes 107A-C and that each of the third vertical electrodes 109A-C are electrically connected to and thus communicative with corresponding sets of vertically aligned patterned conductive elements. For example, the first vertical electrode 105A is electrically connected to and thus communicative with the vertically aligned patterned conductive elements in the first vertically aligned horizontal electrode layers 104A-C.

Finally, it is to be understood that the vertical resistive unit 100 can be operably disposed above a first metallization level as illustrated in FIGS. 3, 5, . . . , 13 and 15 (to be described below) and below a second metallization level in a wafer assembly. Each of the first, second and third vertically aligned horizontal electrode layers 104A-C, 106A-C and 108A-C and each of the first, second and third vertical electrodes 105A-C, 107A-C and 109A-C provide for electrical connection and communication between various components of at least the first and second metallization levels.

With reference to FIG. 2A, which only illustrates the first and second ReRAM cells 101 and 102, each of the first vertically aligned horizontal electrode layers 104A-C is arranged side-by-side in a horizontal or substantially horizontal row with a corresponding one of the second vertically aligned horizontal electrode layers 106A-C. That is, first vertically aligned horizontal electrode layer 104A and second vertically aligned horizontal electrode layer 106A are side-by-side one another and form row 110A, first vertically aligned horizontal electrode layer 104B and second vertically aligned horizontal electrode layer 106B are side-by-side one another and form row 110B and first vertically aligned horizontal electrode layer 104C and second vertically aligned horizontal electrode layer 106C are side-by-side one another and form row 110C. It is to be understood that the various rows need not be continuous, sequential or horizontally aligned, however, and that the various rows could be formed with multiple configurations.

As shown in FIG. 2A, the first ReRAM cell 101 and the second ReRAM cell 102 are disposed relative to one another so as to define an air gap 120 between the first ReRAM cell 101 and the second ReRAM cell 102. The air gap 120 extends at least from between respective lowest ones and highest ones of the first and second vertically aligned horizontal electrode layers (i.e., between first vertically aligned horizontal electrode layer 104A and second vertically aligned horizontal electrode layer 106A at row 110A and first vertically aligned horizontal electrode layer 104C and second vertically aligned horizontal electrode layer 106C at row 110C).

In some embodiments, the air gap 120 extends beyond rows 110A and 110C as well. For example, in some embodiments, the air gap 120 extends to the first metallization level below row 110A and, in some embodiments, the air gap 120 extends along substantial vertical lengths of the first and second vertical electrodes 105A-C and 107A-C.

FIG. 2B depicts an expanded view of a region 202 shown in FIG. 2A. With reference back to FIG. 1, each of the first, second and third vertical electrodes 105A-C, 107A-C and 109A-C includes a conductive element 130 and a liner element 131. In accordance with embodiments and, with continued reference to FIG. 2A and with additional reference to region 202 in FIG. 2B, the liner elements 131 extend along and circumferentially surround the vertical lengths of the conductive elements 130. The conductive elements 130 can be formed of at least one of tungsten and copper and the liner 131 can be provided as a two-layer liner including an exterior layer 1311 of an oxide and an interior layer 1312 of a reactive electrode material. The oxide can include at least one of hafnium oxide and tantalum oxide and the reactive electrode material can include at least one of titanium nitride and an aluminum alloy.

A vertical resistive unit fabrication method will now be described with reference to FIGS. 3-16.

With reference to FIGS. 3A, 3B and 4, initial operations of the vertical resistive unit fabrication method will now be described.

As shown in FIG. 3A, a first layer 301 of a first dielectric material, such as silicon nitride or another suitable dielectric material, is deposited on a conductive or metallic substrate (hereinafter referred to as a "metallic substrate") 302. The metallic substrate 302 can be provided as part of or within a first metallization level. A second layer 303 of a second dielectric material, such as silicon dioxide or another suitable dielectric material (which is otherwise different from the first dielectric material), is deposited on the first layer 301. A first row 304 of horizontal electrode layers 305 is then formed on the second layer 303. The first row 304 can include one or more (e.g., three) horizontal electrode layers 305A, 305B and 305C (see FIG. 4). Each horizontal electrode layer 305A-C extends along a variable longitudinal length thereof and is separated from a neighboring horizontal electrode layer by a variable distance. Each horizontal electrode layer 305A-C includes first and second horizontal layers 306 and 307 (see FIG. 3B) of the first dielectric material and patterned conductive elements 308. As also shown in FIG. 3A, the patterned conductive elements 308 are interleaved in a horizontal array pattern between corresponding sections of the first and second horizontal layers 306 and 307. The horizontal array pattern can be provided or configured as a linear arrangement of the patterned conductive elements 308 that extends along the longitudinal length of the corresponding horizontal electrode layer.

Once the first row 304 of the horizontal electrode layers 305 is formed on the second layer 303, an additional layer 309 of the second dielectric material is deposited on and about the row 304 of the horizontal electrode layers 305. At this point, the forming of the row of the horizontal electrode layers and the depositing of the additional layer 309 can be repeated one or more times. For example, a further row 310 of horizontal electrode layers 311 can be formed on the additional layer 309 and a further additional layer 312 of the second dielectric material can be formed on and about the further row 309 of the horizontal electrode layers 311. The row 310 of the horizontal electrode layers 311 can be formed substantially similarly as the row 304 and need not be further described except to note that patterned conductive elements 313 in the row 310 of the horizontal electrode layers 311 are vertically aligned with the patterned conductive elements 308.

Thus, in accordance with embodiments, each horizontal electrode layer can have a silicon nitride/titanium nitride/silicon nitride configuration at each patterned conductive element.

A capping layer 314 of the first dielectric material is deposited onto an uppermost additional layer (i.e., the further additional layer 312 of FIG. 3A).

With reference to FIGS. 5 and 6, intermediate operations of the vertical resistive unit fabrication method will now be described.

As shown in FIG. 5, holes 320 are etched through the various layers and components described above. That is, each hole 320 extends through the capping layer 314, the further additional layer 312, the further row 310, the additional layer 309, the row 304, the second layer 303 and the first layer 301 to the metallic substrate 302 (see FIG. 6). More particularly, each hole 320 extends through a set of vertically aligned patterned conductive elements 308 and 312 in the row 304 and the further row 310.

Figures 7, 8:
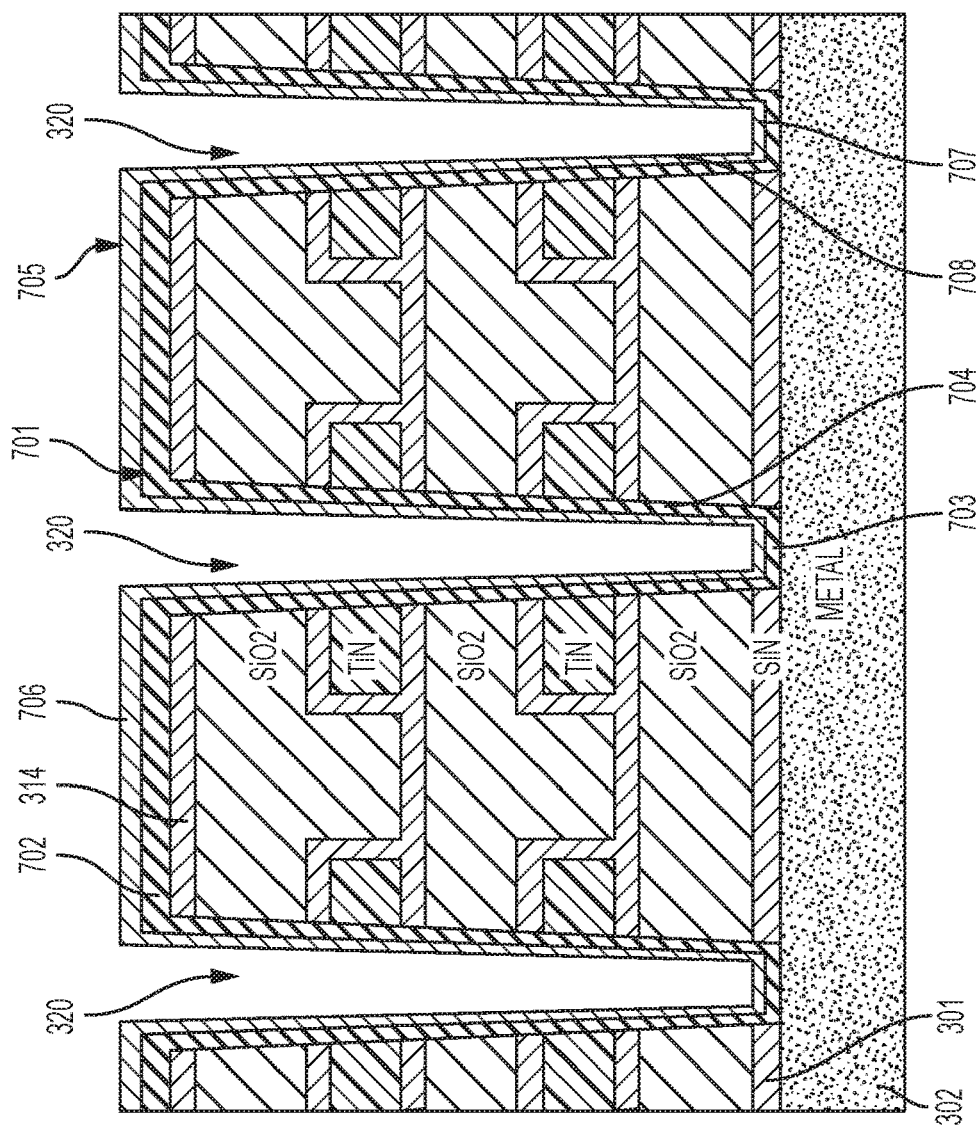
FIG. 7 is a side view of sequential layers deposited in the etched holes in accordance with embodiments of the present invention.
FIG. 8 is a top-down view of the sequential layers of FIG. 7.

With reference to FIGS. 7 and 8, additional intermediate operations of the vertical resistive unit fabrication method will now be described.

As shown in FIG. 7, an oxide is deposited onto the capping layer 314 and into the holes 320 to form an oxide layer 701. The oxide layer 701 thus includes upper sections 702, which lie along the capping layer 314, lower sections 703, which lie along exposed sections of the metallic substrate 302 in the holes 320, and sidewall sections 704 that extend from the lower sections 703 to the upper sections 702 along the sidewalls of the holes 320. The oxide can be selected from the group consisting of hafnium oxide and tantalum oxide. A reactive electrode material is then deposited onto the oxide layer 701 to form a reactive electrode layer 705 (see FIG. 8). The reactive electrode layer 705 thus includes upper sections 706, which lie along the upper sections 702, lower sections 707, which lie along the lower sections 703, in the holes 320, and sidewall sections 708 that extend from the lower sections 707 to the upper sections 706 along the sidewall sections 704. The reactive electrode material can be selected from the group consisting of titanium nitride and aluminum alloy.

Figure 10:
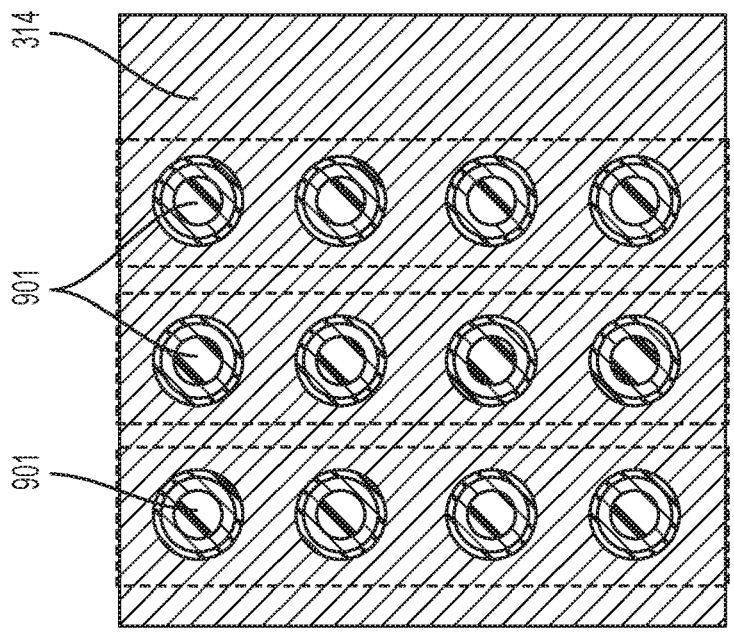
FIG. 10 is a top-down view of the filling of FIG. 9.
Figure 9:
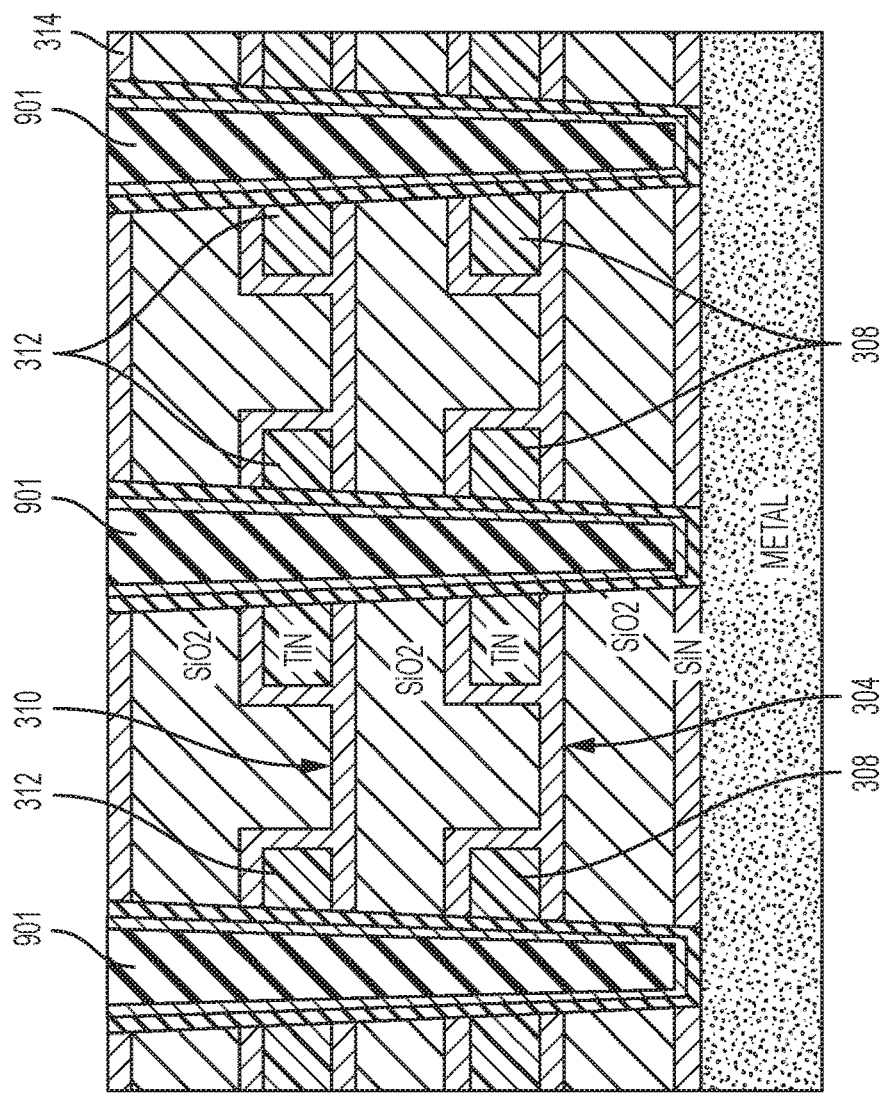
FIG. 9 is a side view of filling filled in the remainders of the etched holes in accordance with embodiments of the present invention.

With reference to FIGS. 9 and 10, additional intermediate operations of the vertical resistive unit fabrication method will now be described.

As shown in FIG. 9, remainders of the holes 320 are filled with conductive material to form vertical electrodes 901 (see the arrangement of the vertical electrodes in FIG. 10). The conductive material can be selected from the group consisting of tungsten and copper. Once formation of the vertical electrodes 901 is complete, the vertical electrodes 901 are electrically communicative with the corresponding sets of the vertically aligned patterned conductive elements 308 and 312 in the row 304 and the further row 310. At this point, chemical mechanical polishing (CMP) or another suitable process is executed to planarize the vertical electrodes 901 with the capping layer 314.

Figure 12:
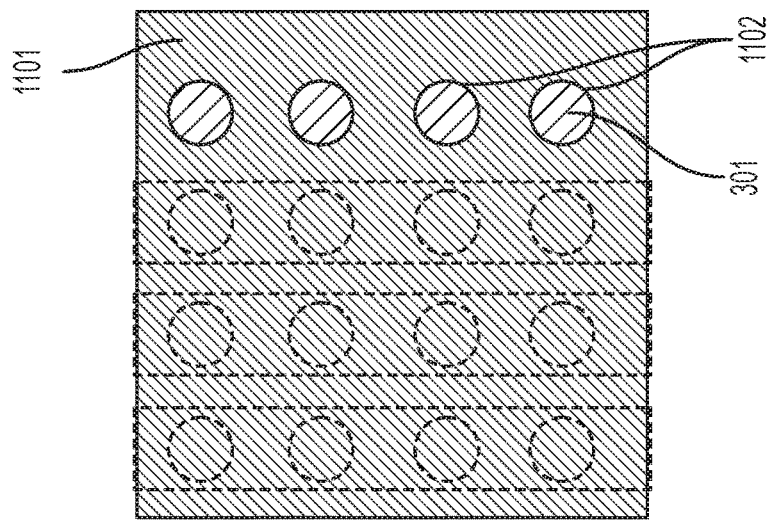
FIG. 12 is a top-down view of the hard mask and the dummy hole of FIG. 11.
Figure 11:
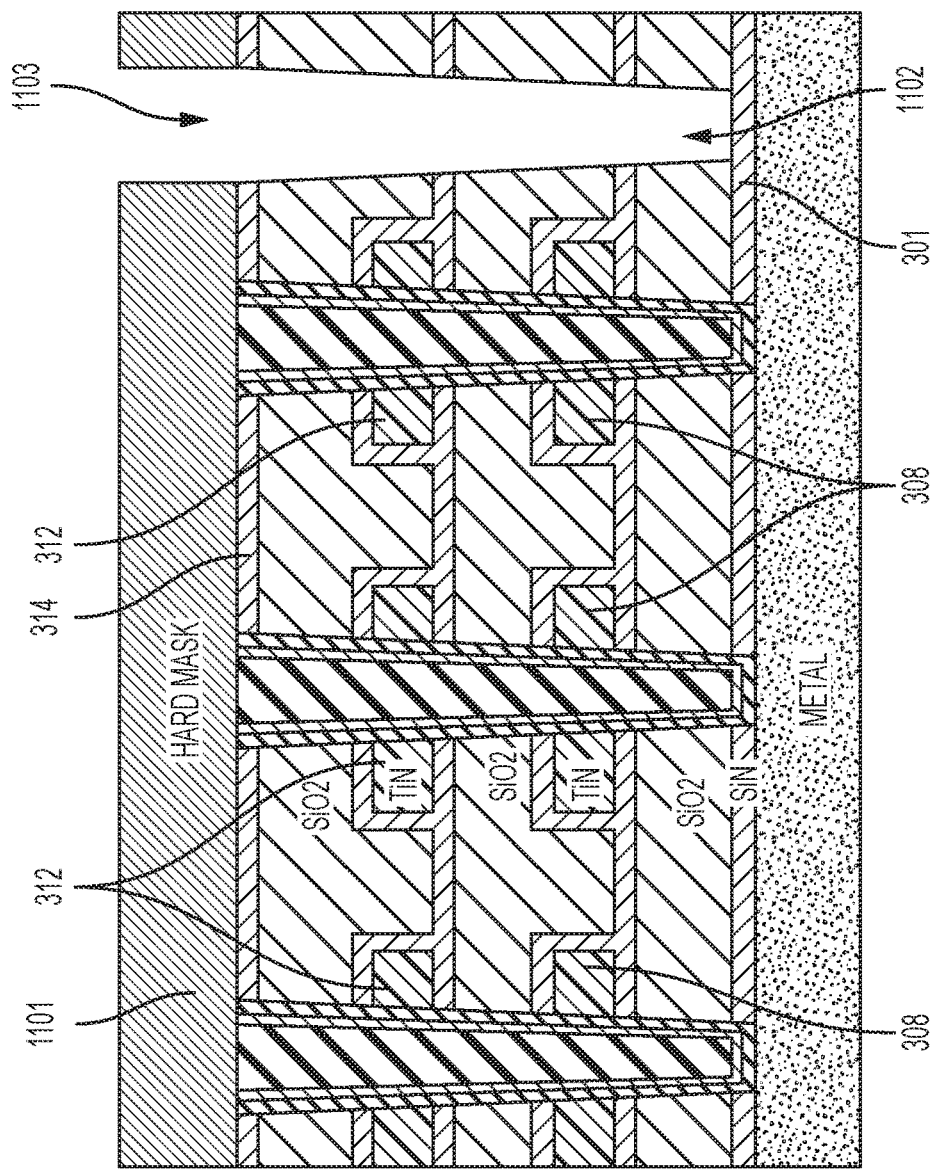
FIG. 11 is a side view of the filling and the sequential layers having been planarized and covered with a hard mask as well as a dummy hole in accordance with embodiments of the present invention.

With reference to FIGS. 11 and 12, further additional intermediate operations of the vertical resistive unit fabrication method will now be described.

As shown in FIG. 11, a hard mask 1101 is deposited onto the capping layer 314 and a dummy hole 1102 is patterned or etched. The dummy hole 1102 is remote from each of the vertical electrodes 901 and the corresponding sets of the vertically aligned patterned conductive elements 308 and 312 in the row 304 and the further row 310 (see FIG. 12). The dummy hole 1102 extends through the hard mask 1101, through an aperture 1103 defined in the capping layer 314, through each of the other various layers described above and terminates at the first layer 301.

Figure 14:
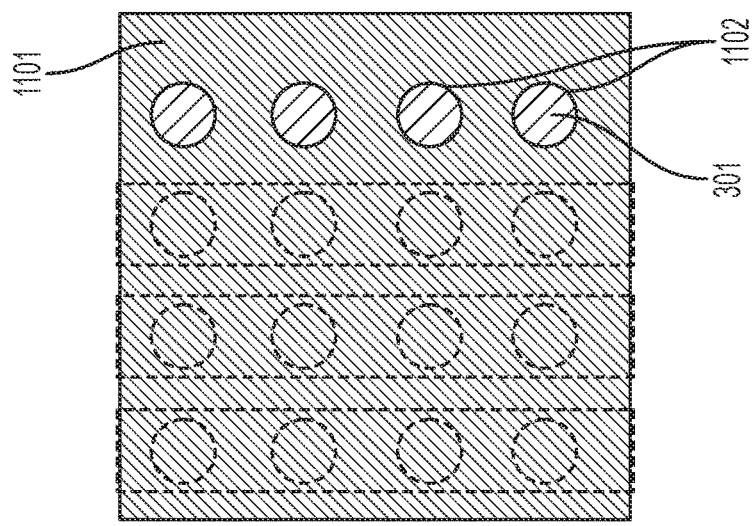
FIG. 14 is a top-down view of the hard mask and the dummy hole of FIG. 11.
Figure 13:
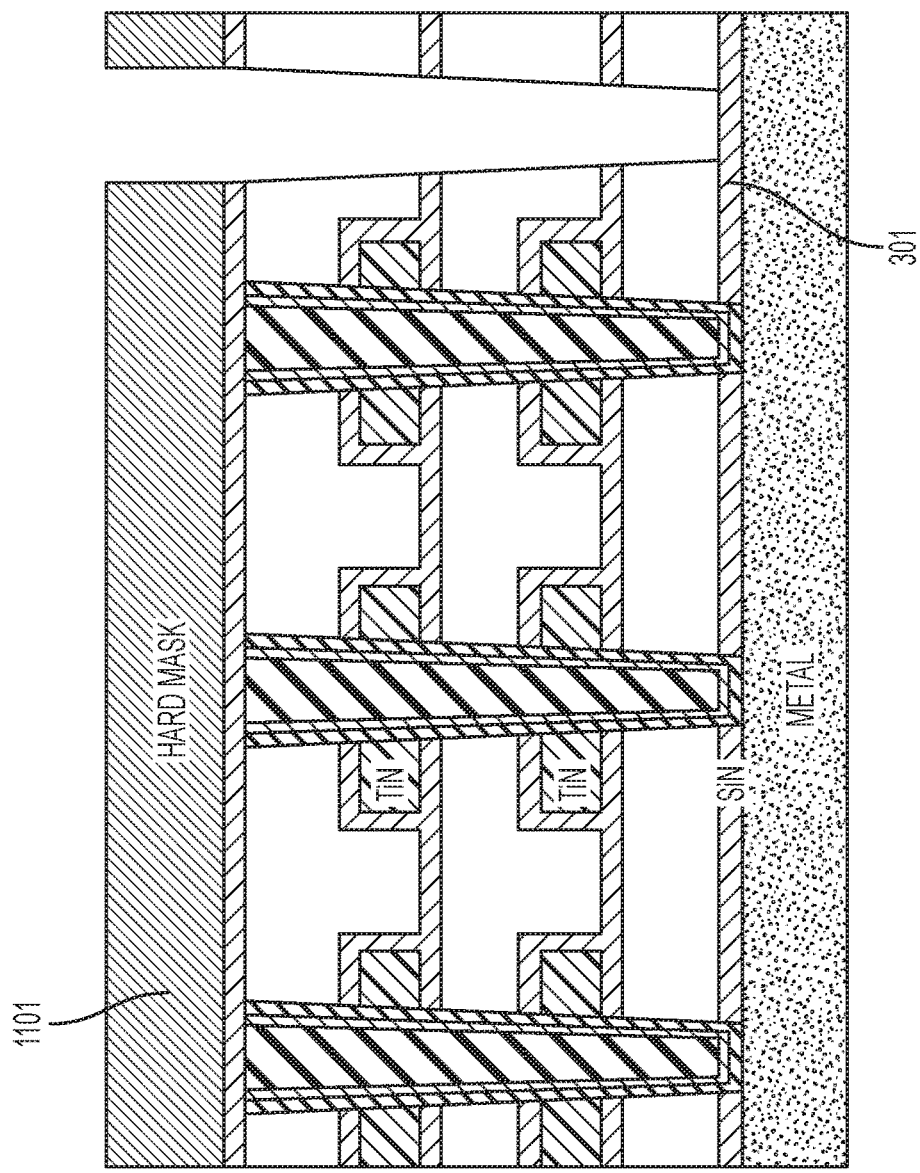
FIG. 13 is a side view of dielectric material having been etched via the dummy hole of FIGS. 11 and 12 in accordance with embodiments of the present invention.

With reference to FIGS. 13 and 14, further additional intermediate operations of the vertical resistive unit fabrication method will now be described.

As shown in FIGS. 13 and 14, the second dielectric material that is exposed by way of the dummy hole 1102 is etched while the first dielectric material and the exposed portions of the oxide layer 701 are preserved.

Figure 16:
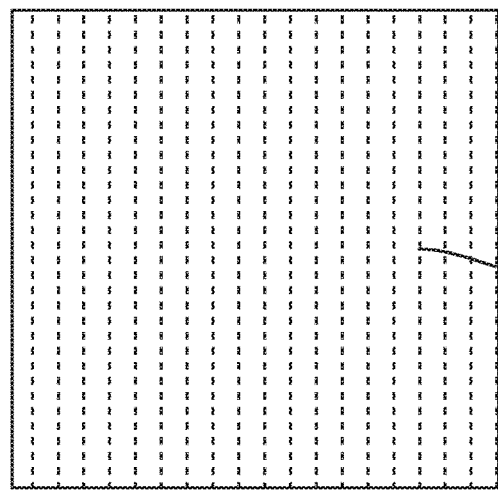
FIG. 16 is a top-down view of the capping layer of FIG. 15.
Figure 15:
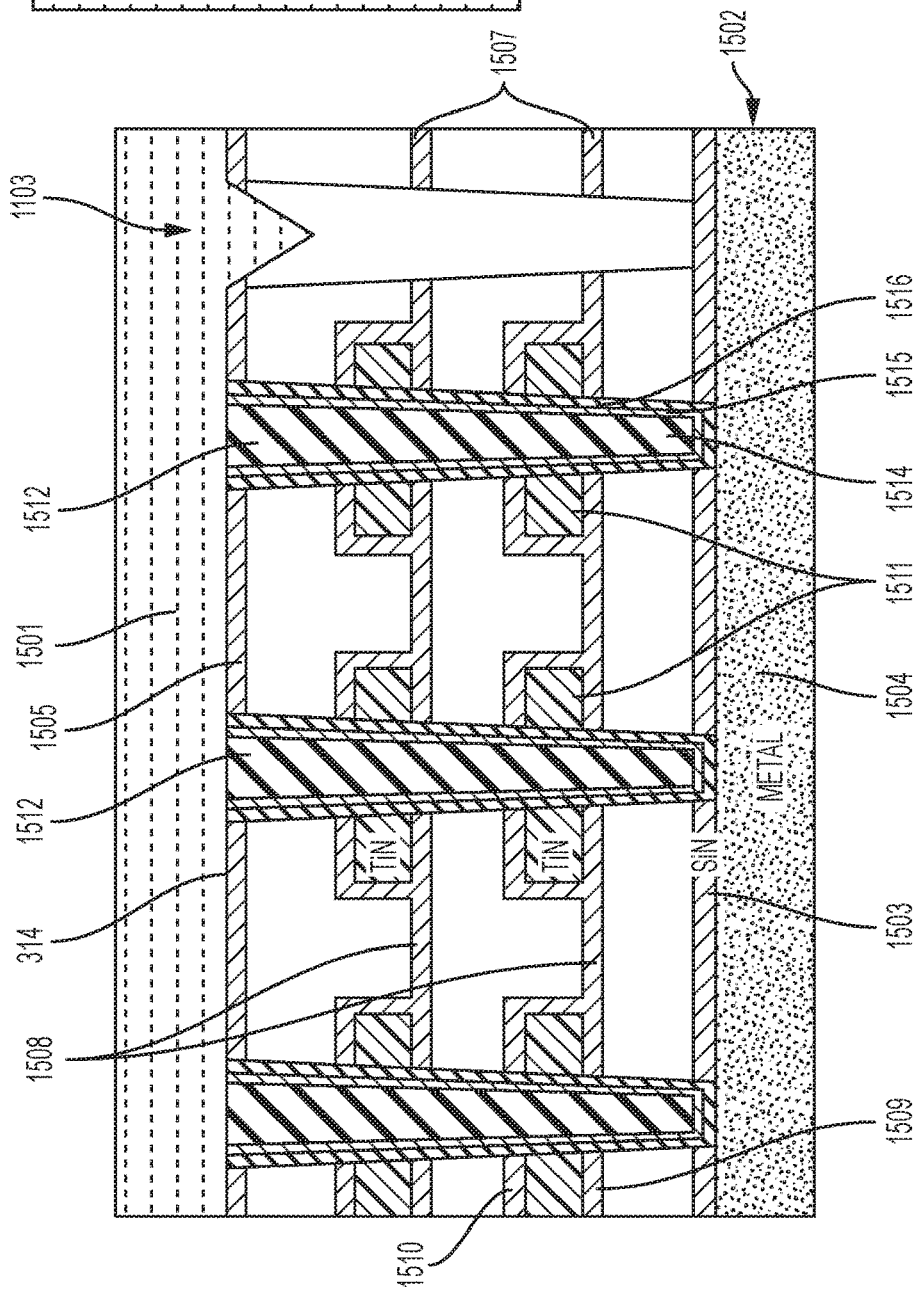
FIG. 15 is a side view of a capping layer having been deposited in accordance with embodiments of the present invention.

With reference to FIGS. 15 and 16, late operations of the vertical resistive unit fabrication method will now be described.

As shown in FIG. 15, once the second dielectric material is etched, the hard mask 1101 is removed and the aperture 1103 defined in the capping layer 314 is pinched-off as a result of a non-conformal oxide deposition that results in the formation of pinch-off layer 1501 (see FIGS. 15 and 16). The non-conformal oxide deposition can be executed as a plasma-enhanced chemical vapor deposition (PECVD) of silicon nitride or high-density plasma (HDP) silicon nitride.

The structure illustrated in FIG. 15 results from the preceding operations and is a vertical resistive unit 1502. The vertical resistive unit 1502 includes a first dielectric material layer 1503 that is disposed on a conductive or metallic substrate 1504, a dielectric material capping layer 1505 defining a dummy hole aperture 1103 (as described above) and one or more rows 1507 of horizontal electrode layers 1508. The one or more rows 1507 of the horizontal electrode layers 1508 are interposed between the first dielectric material 1503 layer and the dielectric material capping layer 1505. Each horizontal electrode layer 1508 respectively includes first and second horizontal dielectric material layers 1509 and 1510 and conductors 1511. The conductors 1511 are interleaved in a pattern between corresponding sections of the first and second horizontal dielectric material layers 1509 and 1510. The vertical resistive unit 1502 further includes vertical electrodes 1512 and a layer of non-conformal dielectric material 1501 (as described above). The vertical electrodes 1512 extend through sets of vertically aligned conductors 1511 of vertically aligned horizontal electrode layers 1508. The vertical electrodes 1512 include sequential layers of oxide, reactive electrode material and conductive material 1514, 1515 and 1516. The layer of non-conformal dielectric material 1501 is disposed on the dielectric material capping layer 1505 to pinch-off the dummy hole aperture 1103.

With reference to FIG. 17, a vertical resistive unit fabrication method is provided in accordance with embodiments of the present invention. The vertical resistive unit fabrication method includes an initial sequential deposit of first and second layers of first and second dielectric materials, respectively, onto a metallic substrate (block 1701). The vertical resistive unit fabrication method then includes an iterative formation, on the second layer, of a row of horizontal electrode layers as described above (block 1702) followed by a deposition of an additional layer of the second dielectric material about the row of the horizontal electrode layers (block 1703). The iterative formation and deposition of block 1702 and 1702 can be repeated one or more times until a capping layer of the first dielectric material is deposited onto an uppermost additional layer (block 1704). At this point, holes are etched through vertically aligned conductors (block 1705) and the holes are sequentially filled with oxide, reactive electrode material and conductive material to form vertical electrodes (block 1706). Next, the second dielectric material, which is exposed by a dummy hole that extends to the first layer, is etched (block 1707) and non-conformal dielectric material is deposited to pinch off the dummy hole (block 1708).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A vertical resistive unit, comprising:
   a first resistive random access memory (ReRAM) cell comprising first vertically aligned horizontal electrode layers and first vertical electrodes operably extending through respective entire vertical thicknesses of each of the first vertically aligned horizontal electrode layers to make physical contact with each of the first vertically aligned horizontal electrode layers; and
   a second ReRAM cell comprising second vertically aligned horizontal electrode layers and second vertical electrodes operably extending through respective entire vertical thicknesses of each of the second vertically aligned horizontal electrode layers to make physical contact with each of the second vertically aligned horizontal electrode layers,
   the first and second ReRAM cells being disposed to define an air gap between the first and second ReRAM cells.

2. The vertical resistive unit according to claim 1, wherein the air gap extends at least from between respective lowest ones and respective highest ones of the first and second vertically aligned horizontal electrode layers.

3. The vertical resistive unit according to claim 1, wherein at least one first vertical electrode and at least one second vertical electrode are electrically connected.

4. A vertical resistive unit fabrication method comprising:
   sequentially depositing first and second layers of first and second dielectric materials, respectively, onto a conductive substrate;
   forming, on the second layer, a row of horizontal electrode layers respectively comprising first and second horizontal layers of the first dielectric material and conductors interleaved in a pattern between corresponding first and second horizontal layer sections such that a set of the conductors are arranged as vertically aligned conductors;
   depositing an additional layer of the second dielectric material about the row of the horizontal electrode layers;
   repeating the forming of the row of the horizontal electrode layers and the depositing of the additional layer;
   depositing a capping layer of the first dielectric material onto an uppermost additional layer;
   forming holes through respective entire vertical thicknesses of the vertically aligned conductors of the set of the conductors;
   sequentially filling each of the holes with oxide, reactive electrode material and conductive material to form vertical electrodes in physical contact with each of the vertically aligned conductors of the set of the conductors; and
   etching the second dielectric material exposed by a dummy hole extending to the first layer.

5. The vertical resistive unit fabrication method according to claim 4, wherein the first dielectric material comprises silicon nitride.

6. The vertical resistive unit fabrication method according to claim 4, wherein the second dielectric material comprises silicon dioxide.

7. The vertical resistive unit fabrication method according to claim 4, wherein the conductors comprise titanium nitride.

8. The vertical resistive unit fabrication method according to claim 4, wherein:
the horizontal electrode layers of each row are arranged side-by-side, and
the conductors are arranged in a horizontal array pattern along respective lengths of the horizontal electrode layers.

9. The vertical resistive unit fabrication method according to claim 4, wherein the etching of the holes through the vertically aligned conductors of the set of the conductors comprises etching the holes to the conductive substrate.

10. The vertical resistive unit fabrication method according to claim 4, wherein:
the oxide comprises at least one of hafnium oxide and tantalum oxide,
the reactive electrode material comprises at least one of titanium nitride and aluminum alloy, and
the conductive material comprises at least one of tungsten and copper.

11. The vertical resistive unit fabrication method according to claim 4, wherein the etching comprises:
planarizing the oxide, the reactive electrode material and the conductive material with the capping layer; and
depositing and patterning a hardmask onto the planarized oxide, reactive electrode material, conductive material and the capping layer.

12. The vertical resistive unit fabrication method according to claim 4, wherein the dummy hole is displaced from vertically aligned conductors.

13. The vertical resistive unit fabrication method according to claim 4, further comprising depositing non-conformal dielectric material to pinch off the dummy hole.

14. A vertical resistive unit comprising:
a first dielectric material layer disposed on a conductive substrate;
a dielectric material capping layer defining a dummy hole aperture;
one or more rows of horizontal electrode layers interposed between the first dielectric material layer and the dielectric material capping layer,
each horizontal electrode layer respectively comprising first and second horizontal dielectric material layers and conductors interleaved in a pattern between corresponding sections of the first and second horizontal dielectric material layers;
vertical electrodes extending through respective entire vertical thicknesses of vertically aligned conductors of vertically aligned horizontal electrode layers and comprising sequential layers of oxide, reactive electrode material and conductive material making physical contact with each of the vertically aligned conductors of the vertically aligned horizontal electrode layers; and
a layer of non-conformal dielectric material disposed on the dielectric material capping layer to pinch-off the dummy hole aperture.

15. The vertical resistive unit according to claim 14, wherein the first dielectric material layer, the dielectric material capping layer and the first and second horizontal dielectric material layers comprise silicon nitride.

16. The vertical resistive unit according to claim 14, wherein:
the horizontal electrode layers of each row are arranged side-by-side, and
the conductors are arranged in a horizontal array pattern along respective lengths of the horizontal electrode layers.

17. The vertical resistive unit according to claim 14, wherein the oxide layers of the vertical electrodes abut the conductive substrate.

18. The vertical resistive unit according to claim 14, wherein the oxide comprises at least one of hafnium oxide and tantalum oxide.

19. The vertical resistive unit according to claim 14, wherein the reactive electrode material comprises at least one of titanium nitride and aluminum alloy.

20. The vertical resistive unit according to claim 14, wherein:
the oxide comprises at least one of hafnium oxide and tantalum oxide,
the reactive electrode material comprises at least one of titanium nitride and aluminum alloy, and
the conductive material comprises at least one of tungsten and copper.

* * * * *